United States Patent [19]

Kleinhans et al.

[11] Patent Number: 5,165,272
[45] Date of Patent: Nov. 24, 1992

[54] DEVICE FOR REDUCING NOISE DURING POTENTIOMETER EVALUATION

[75] Inventors: Josef Kleinhans, Vaihingen/Enz; Rudolf Sauer, Benningen; Heinrich Steinruecken, Ludwigsburg; Armin Witzig, Renningen, all of Fed. Rep. of Germany

[73] Assignee: Robert Bosch GmbH, Stuttgart, Fed. Rep. of Germany

[21] Appl. No.: 697,877

[22] Filed: May 9, 1991

[30] Foreign Application Priority Data

Jun. 23, 1990 [DE] Fed. Rep. of Germany ....... 4020105

[51] Int. Cl.[5] ..................... H03F 1/26; H04B 15/02
[52] U.S. Cl. ..................... 73/118.1; 73/118.2; 324/723; 324/128
[58] Field of Search ............... 324/99 R, 99 D, 100, 324/128, 103, 603, 723; 340/870.38; 338/187, 199; 73/118.1, 118.2

[56] References Cited

U.S. PATENT DOCUMENTS

| | | | |
|---|---|---|---|
| 2,951,211 | 8/1960 | Brashear | 324/99 R |
| 2,999,965 | 9/1961 | Airey | 324/99 R |
| 3,654,545 | 4/1972 | Demark | 340/870.38 |
| 3,812,712 | 5/1974 | Hoffman | 340/870.38 |
| 4,893,502 | 1/1990 | Kubota | 73/118.1 |
| 4,901,561 | 2/1990 | Glowczewski | 73/118.1 |
| 4,915,075 | 4/1990 | Brown | 73/118.1 |
| 4,972,816 | 11/1990 | Mausner | 324/723 |

FOREIGN PATENT DOCUMENTS

1435124 5/1976 United Kingdom ........... 340/870.88

*Primary Examiner*—Kenneth A. Wieder
*Assistant Examiner*—Jose M. Solis
*Attorney, Agent, or Firm*—Michael J. Striker

[57] ABSTRACT

A device for noise peak suppression during a potentiometer evaluation has a potentiometer located between a reference voltage and mass and having a slider with a slider output, a control device adapted to receive a signal from the slider output of the potentiometer, and an amplifying unit located between the potentiometer and the control device so that a signal picked up from the slider output is amplified in the amplifying unit before being supplied to the control device.

11 Claims, 3 Drawing Sheets

DEVICE FOR REDUCING NOISE DURING POTENTIOMETER EVALUATION

BACKGROUND OF THE INVENTION

The present invention relates to a device for reducing the noise during a potentiometer evaluation. In particular, it relates to a device for reducing the noise during evaluation with a throttle flap potentiometer or an air mass measuring potentiometer, for example an air flow sensor flap of an internal combustion engine.

It is well known in the prior art that the position of the throttle flap, from which the quantity of the air aspirated by the internal combustion engine depends, is determined with the aid of a throttle flap potentiometer. The throttle flap potentiometer correspond to a mechanically variable resistance which is connected as a voltage divider and the signal voltage is taken at its slider output. Only relatively narrow tolerances are permitted for the electrical values due to the required accurate association of the voltage values and the potentiometer position. They also must be maintained over a long operational time. Because of aging, action of oil, fuel, condensation water, etc. the transfer resistance of the slider can be changed so that the undesired voltage breaks occur and lead to a noisy signal. As a result, the relationship of the signal voltage and the slider position can be erroneous which in turn can lead to undesirable travelling conditions.

SUMMARY OF THE INVENTION

Accordingly, it is an object of the present invention to provide a device for reducing noise during a potentiometer evaluation, which avoids the disadvantages of the prior art.

More particularly, it is an object of the present invention to provide a device for reducing the noise during a potentiometer evaluation, which substantially prevents the voltage breaks by reducing the potentiometer current picked off on the slider of the potentiometer.

In keeping with these objects and with others which will become apparent hereinafter, one feature of the present invention resides, briefly stated, in a device for reducing noise during a potentiometer evaluation in accordance with which the output signal of the potentiometer is amplified in an amplifying unit located between the potentiometer and a control device.

By filtering of the potentiometer output signal, for example in a subsequently arranged RC-filter, a smoothing of the potentiometer signal is obtained.

The subsequent amplification of the potentiometer signal provides for unobjectionable further evaluation, for example in a computing device which allows a reliable recognition of an erroreous operation or circuit breakage.

In accordance with an advantageous embodiment of the invention the amplifier circuit can be arranged on an adaptor plug which is directly plugged in the output of the potentiometer. Thereby the amplifier circuit is located closely on the potentiometer so as to reduce the interference susceptibility.

In accordance with another feature of the present invention the slider current does not exceed a predetermined value. It can be less than a microampere.

The amplifying unit can be an operation amplifier with a diode in its feedback branch. In this case the anode of the diode can be connected with the output of the operational amplifier and the cathode of the diode can be connected with an input of the operational amplifier and the control device. The other input of the operational amplifier can be connected with the potentiometer.

The feedback branch of the amplifying unit can be provided with an RC-filter.

The slider output of the potentiometer can be connected with the non-inverting input of the operational amplifier, and a smoothing capacitor can be located between the non-inverting input of the operational amplifier and the mass.

In accordance with still a further feature of the present invention, a potentiometer can be surrounded by a potentiometer chamber. The amplifying unit can be located inside the potentiometer chamber.

Finally, the potentiometer can be formed as a ceramic potentiometer, and the amplifying unit can be mounted as a hybrid circuit on the ceramic substrate.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1A:
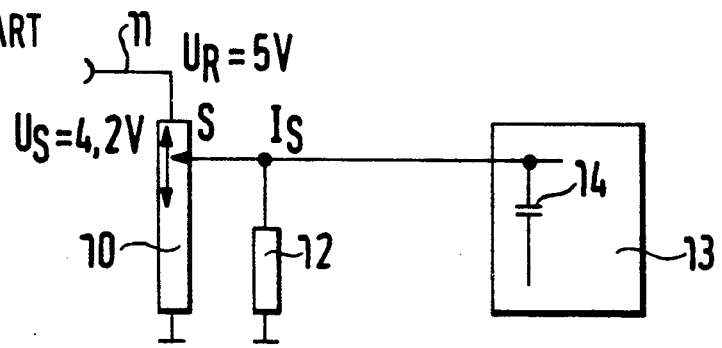
FIGS. 1a and 1b show a testing circuit with an additional filter and without it, with which the fluctuation rests are performed.

In a device shown in FIG. 1a, a potentiometer 10 is located between a terminal 11 to which a reference voltage $U_R$ is applied and a mass. The potentiometer 10 is for example a throttle flap potentiometer or an air quantity measuring potentiometer. The potentiometer 10 has a slider output S which is connected with mass through a resistance 12 and moreover is directly connected with an oscillograph 13. The oscillograph has an input capacitor 14 which together with resistance 11 operates as a filter with a time constant of $\tau = 2$ microseconds ($\tau = 2$ us).

The slider position of the potentiometer is selected so that a voltage of $U_S = 4.2$ V is applied to the slider output S. For changing the slider current $I_S$ taken from the slider output S, three different resistance values of the resistances 12 are evaluated after one another, namely 52 k$\Omega$, 500 k$\Omega$ and 5.1 M$\Omega$. Therefore slider current $I_S$ of 80 microampere (80 $\mu$A), 8.4 microampere and 0.82 microampere is obtained.

Figure 1B:
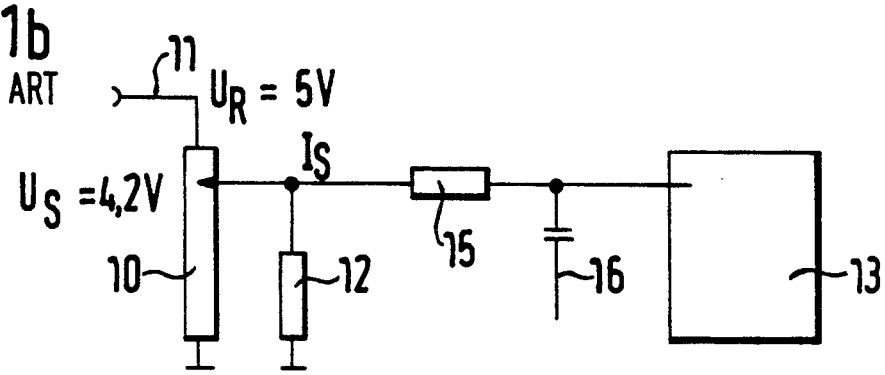

The known arrangements shown in FIG. 1a is expanded in FIG. 1b by a resistor 15 and a capacitor 16 which together form a filter with a time constant of $= 220$ microseconds.

The voltage between the terminal 11 and the mass amounts also to 5 volt and the slider voltage to 4.2 volts. The value of the resistance 12 is selected so that the slider current $I_S$ of the same value as in FIG. 1a occurs.

Figure 2A:
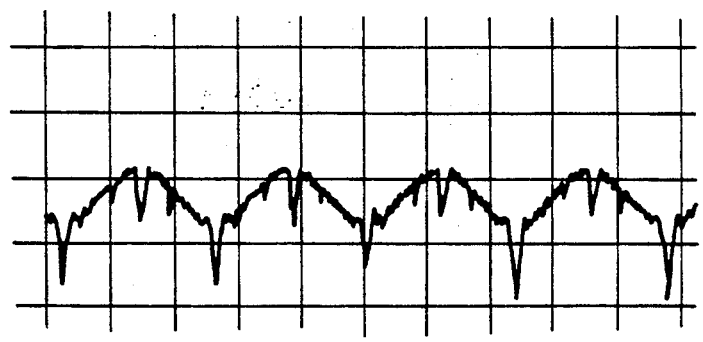
FIGS. 2a, 2b, 2c show the diagram of slider current for three different conditions.
Figure 2B:
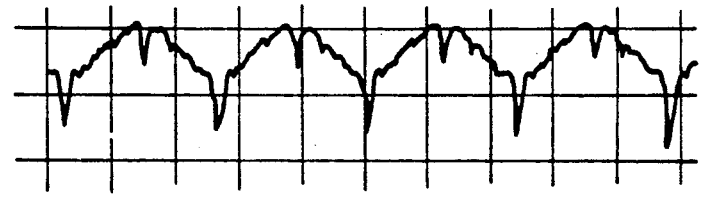
Figure 2C:
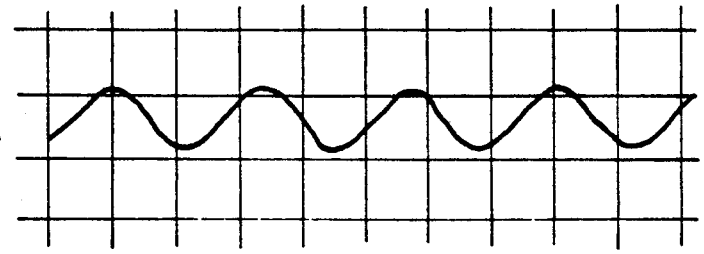

The known devices shown in FIGS. 1a and 1b are subjected to fluctuation tests, and slider currents $I_S$ is produced as shown in FIGS. 2a, 2b, 2c.

During fluctuation tests the slider is reciprocatingly moved in direction of the double arrow shown in FIG. 1a, so that a movement is produced which imitates the real conditions in a power vehicle. For the fluctuation tests the following parameters are selected:
Frequency of the flucuation movement: 40–50 Hz
Angle of the fluctuation movement: 2°
Contact pressure: 12
Supply voltage $U_R = 5$ V Because of the fluctuation movements the slider voltage changes substantially between 4.1 V and 4.3 V with an adjusted slider voltage of 4.2 V, and therefore leads to a sinus-shaped variations of the slider current $I_S$.

FIG. 2a shows a curve of the slider current $I_S$ which leads to a corresponding voltage in the oscillograph connected therewith for a slider current of substantially 80 microampere and a fluctuation movement with 50 Hertz. During the maximum or the minimum of the fluctuation movement voltage breaks occur which are caused by the slider dust (abrasion) deposited in these points and amounts to 0.3 Volt in the selected circuit example. The voltage fluctuations measured with the oscillograph amount to a total to 0.2–0.3 volts. The signal course in accordance with FIG. 2a is obtained with a device shown in FIG. 1 and a load resistance 11 of 52 k $\Omega$.

A signal curve corresponding to FIG. 2b is obtained under the same conditions, but with an additional filter in accordance with FIG. 1b. This signal is totally smoothed, and the voltage breaks however occur in the maximum and minimum. If the resistance 11 is further increased, for example with the reduction of the slider current $I_S$, the voltage breaks somewhat reduce but they are still not neglectable.

With a reduction of the slider current to 0.82 microampere, which corresponds to a resistance 11 of 5.1 M $\Omega$, a signal curve is obtained which has no voltage breaks. FIG. 2c shows this for a device of FIG. 1a without an additional filter, and with the device of FIG. 1b further smoothings are obtained.

Since the reduction of the slider current $I_S$ to values less than 1 microampere has no current or voltage breaks it is necessary to take care that the slider current $I_S$ picked up at the slider output $I_S$ remains limited to such a small value. For the subequent evaluation in a control device, current of several zig-microampere, for example 40 microampere are however required and therefore the slider current $I_S$ must be amplified with an amplifying unit to the required values.

Figure 3:
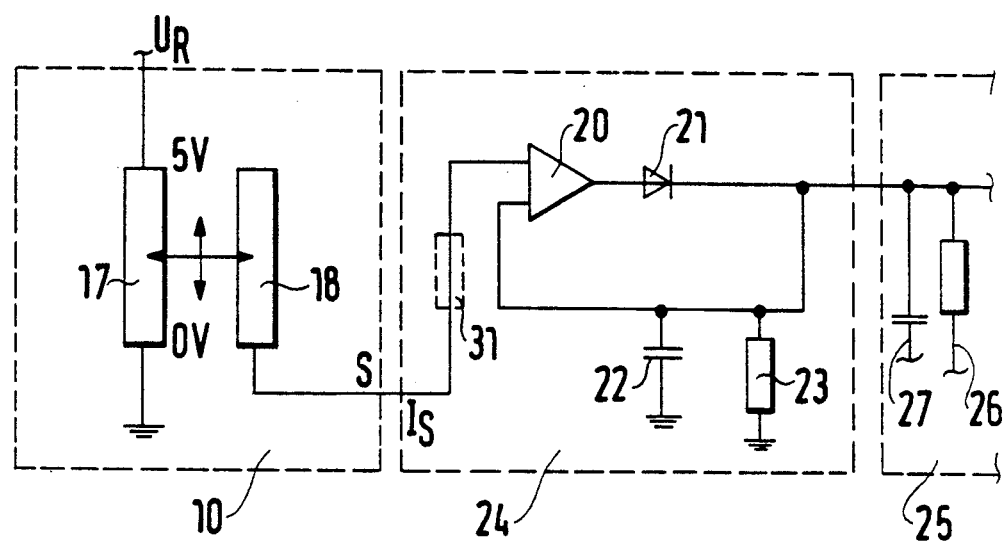
FIG. 3 shows a first embodiment of a potentiometer evaluating circuit.

FIG. 3 shows a first device, in which the slider current $I_S$ picked up as the potentiometer is amplified for its supply to a control device.

Reference numeral 10 identifies a potentiometer which is located between the reference voltage $U_R$ and the mass. The potentiometer has a potentiometer path 7 and a collector path 18. The slider 19 reciprocates synchronously on the potentiometer path 17 and the collector path 18. when the potentiometer 10 corresponds to a throttle flap potentiometer, in the device in accordance with FIG. 3, a slider displacement near the reference voltage input is equated with a completely open throttle flap while the opposite position corresponds to a complete closed throttle flap.

The output S of the potentiometer at which the current $I_S$ occurs is connected with an input of an operational amplifier 20. A further input of the operational amplifier 20 is connected through a diode 21 with the output of the operational amplifier 20. A capacitor 22 and a resistance 23 are located between this connection and mass. The supply of the operational amplifier 20 is performed through a further input which is connected to a supply voltage $U_R$.

The amplifying unit 24 is connected with a control device 25 via the cathode of a diode 21. An input of the control device 25 is connected with an R-C filter 26, 27.

The slider current $I_S$ picked up at the slider output S and dependent on the slider position is amplified in the amplifying unit 24 so that a current of at least 40 microampere is supplied to the control device 25. By respective dimensioning of the circuit it is necessary to take care that the slider current $I_S$ for each slider position remains smaller than 1 microampere. In some cases an additional resistance 31 is introduced, which limits the current flow $I_S$ so that $I_S$ is always smaller than 1 $\mu$A. When the current picked up at the slider output S is smaller than 1 microampere, it is guaranteed that the current or voltage breaks occur only seldom. Simultaneously it is guaranteed that such a current is supplied to the control device which is high enough to obtain a diagnosis or in other words a determination whether an error operation of the potentiometer or a break of this signal circuit occurs and therefore to provide a reliable signal transmission at all times.

The three structural elements 21, 22, 23 which are associated with the operational amplifier 20 actuate on the one hand a current amplification and form a filter arrangement on the other hand. The time constant of the filter arrangement is dependent on whether a voltage change occurs lower to higher values or higher to lower values.

Such a different time constant is especially desirable during the evaluation of throttle flap potentiometers. The reason is that the closing speed of the throttle flap is usually slower than the opening speed, which when needed amounts to substantially 50 milliseconds during a sudden acceleration, and the throttle flap during this 50 milliseconds changes from the empty running position to the full loading position.

In order to reliably filter out the eventually occurring breaks of the slider current $I_S$ which have a duration of approximately 1 $\mu$s, the filter time constant $\tau$ must conventionally amount to only 1–2 milliseconds, while the closing movement with high filter time constants $\tau$ are acceptable for more than 10 milliseconds.

Such high filter time constant $\tau$ during the closing movement of the throttle flap or in other words during the phase of the reduction of the slider voltage $U_S$ is obtained by the diode 21. Thereby breaks are reliably filtered out.

Figure 4:
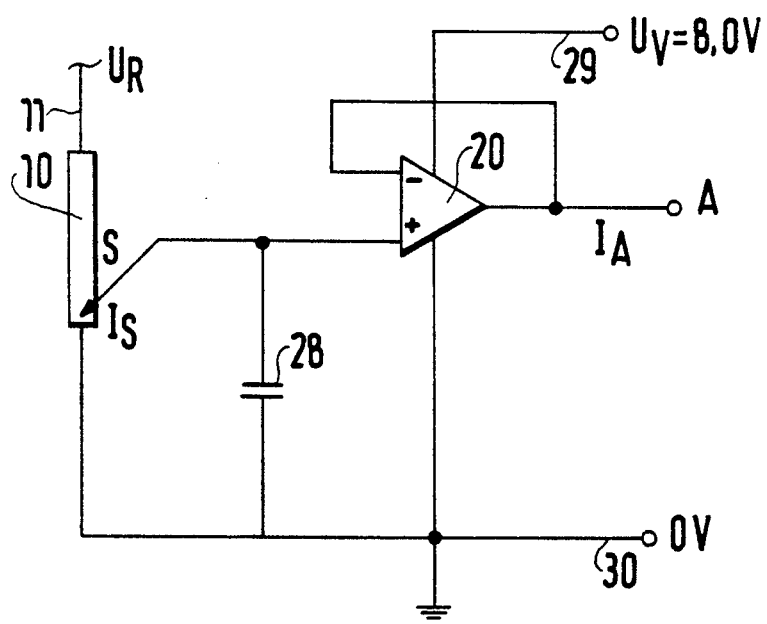
FIGS. 4 and 5 are views showing further embodiments of the present invention.

FIG. 4 shows a further embodiment. Here a potentiometer 10 is connected through a terminal 11 to the reference voltage $U_R$, while the other output of the potentiometer is connected with mass. The slider output S is connected with the non-inverting input of an operational amplifier 20. The inverting input of the operational amplifier 20 is connected directly with its output. A capacitor 28 is located between the non-inverting input of the operational amplifier 20 and mass. The operational amplifier 20 is further connected with a terminal 29 to which the supply voltage $U_V$ is applied, and to a mass terminal 30.

The slider current $I_S$ is picked up at the slider output S and amplified in the operational amplifier 20. Therefore a current $I_A$ occurs at the output A of the operational amplifier 20. The output A of the operational amplifier is conventionally connected with a control device 25 in which the evaluation of the potentiometer current is performed. The supply current $U_V$ corresponds to the reference voltage $U_R$. However, it can be also several volts higher.

The capacitor 28 is used to compensate short-term breaks of the slider current $I_S$. Since it is located at the input side of the operational amplifier 20, it can be very small, and a value of 10 nanofarad is sufficient.

The slider current $I_S$ is so amplified in the operational amplifier 20, for example to 40 $\mu$A, that an unobjectionable further processing can be performed in the control device despite the fact that the slider current is lower than 1 $\mu$A.

Figure 5:
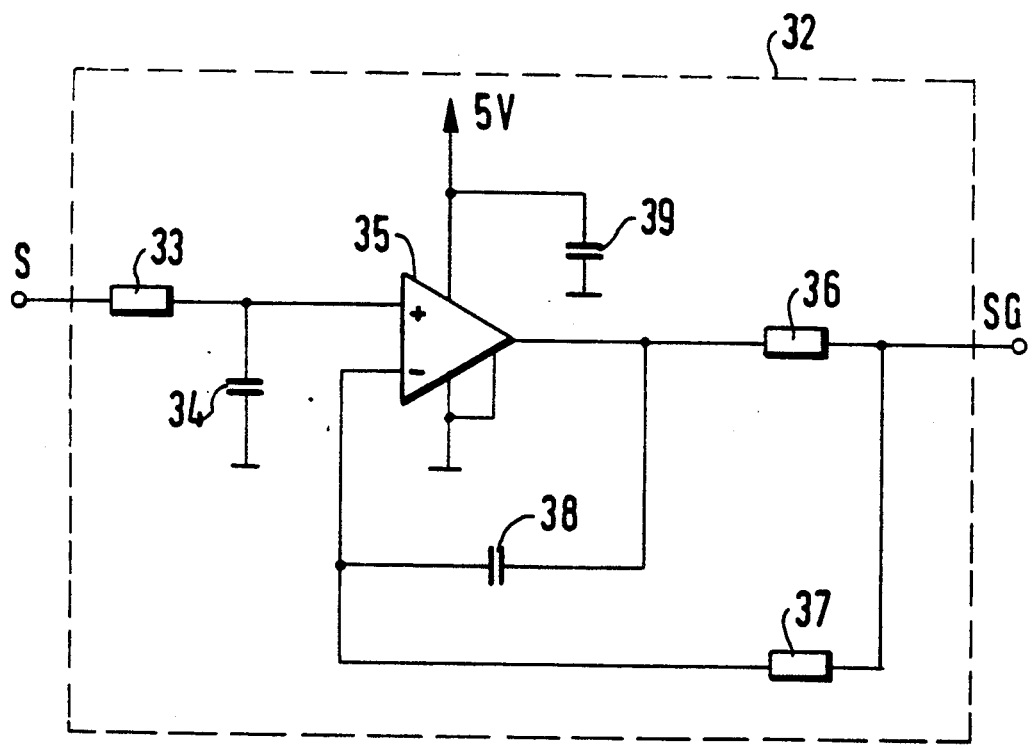

A further embodiment is shown in FIG. 5. An amplifying unit 32 is again arranged between the slider output S and the control device 25. However, its construction is somewhat different from the construction of the amplifying unit 24 of FIG. 3. A low-pass is provided at the input of the amplifier circuit 32 and composed of a resistance 33 and a capacitor 34 connected with mass.

An operational amplifier 35 is connected with the low-pass with the inputs/outputs 2, 3, 4, 5, 6, 7. The output 6 is connected with the control device 25 through a further resistance 36. A further resistance 37 is provided between the inverting input 2 of the operational amplifier 35 and the control device 25. A further capacitor 38 is arranged between the input 2 and the output 6.

The inputs 4 and 5 are connected with mass, and the input 7 is connected with a 5 V supply voltage. A capacitor 39 is additionally arranged between the supply voltage and mass.

The potentiometer signal for example the potentiometer current, which is taken at the slider S and supplied through the amplifying unit 32 to the control device, can be maintained so small due to the amplification in 32 that no voltage breaks occur.

The amplifying device 20, 24 and 32 can be arranged either close to the potentiometer, for example inside the potentiometer chamber in an air mass measuring device. However, it can also be arranged close to or inside the control device 25.

In an especially advantageous manner, the amplifying unit 24, 32 can be arranged on an adaptor plug. The adaptor plug is mounted in a suitable manner on a potentiometer chamber or on the potentiometer housing. The adaptor plug can designed such as for example as dislosed in the German document DE-OS 2,927,295 and perform the mounting in a manner shown in this document. Matching plug connections on the potentiometer and on the plug are required.

The potentiometer can be formed as a ceramic potentiometer. In this case the structural elements required for the amplification can be mounted directly on the ceramic substrate as hybrid circuit.

It will be understood that each of the elements described above, or two or more together, may also find a useful application in other types of constructions differing from the types described above.

While the invention has been illustrated and described as embodied in a device for noise reduction during a potentiometer evaluation, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A device for noise peak suppression during a potentiometer evaluation, comprising a potentiometer located between a reference voltage and mass and formed as one of a throttle flap potentiometer and an air quantity measuring potentiometer, said potentiometer having a slider with a slider output delivering a slider current which by dimensioning of the device is such that it is smaller than one microampere; a control device adapted to receive a signal from said slider output of said potentiometer; and an amplifying unit located between said potentiometer and said control device so that a signal picked up from said slider output is amplified in said amplifying unit before being supplied to said control device.

2. A device as defined in claim 1, wherein said potentiometer is formed as a ceramic potentiometer and has a ceramic substrate, said amplifying unit being formed as a hybrid circuit mounted on said ceramic substrate.

3. A device as defined in claim 1; and further comprising an adaptor plug which is connected with said potentiometer and carries said amplifying unit.

4. A device as defined in claim 1, wherein said amplifying unit includes an operational amplifier having a feedback branch and provided with a diode in said feedback branch.

5. A device as defined in claim 4, wherein said diode has an anode which is connected with an output of said operational amplifier and a cathode which is connected with an input of said operational amplifier and with said control device, said operational amplifier having a further input which is connected with said potentiometer.

6. A device as defined in claim 4, wherein said feedback branch is provided with an R-C-filter.

7. A device as defined in claim 5, wherein said feedback branch is provided with an R-C-filter.

8. A device as defined in claim 1, wherein said amplifying unit has an operational amplifier with a non-inverting input, said slider output of said potentiometer being connected with said non-inverting input of said operational amplifier; and further comprising a smoothing capacitor located between said non-inverting input of said operational amplifier and mass.

9. A device as defined in claim 1; and further comprising a potentiometer chamber which surrounds said potentiometer.

10. A device as defined in claim 9, wherein said amplifying unit is located inside said potentiometer chamber.

11. A device as defined in claim 9; and further comprising an adaptor plug which is connected with said potentiometer chamber and carries said amplifying unit.

* * * * *